(12) United States Patent
Lin et al.

(10) Patent No.: US 10,714,890 B1
(45) Date of Patent: Jul. 14, 2020

(54) TRANSMITTER OPTICAL SUBASSEMBLY ARRANGEMENT WITH VERTICALLY-MOUNTED MONITOR PHOTODIODES

(71) Applicant: Applied Optoelectronics, Inc., Sugar Land, TX (US)

(72) Inventors: Kai-Sheng Lin, Sugar Land, TX (US); Hsiu-Che Wang, Rosenberg, TX (US); Kevin Liu, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/268,765

(22) Filed: Feb. 6, 2019

(51) Int. Cl.
*H01S 5/022* (2006.01)
*H01S 5/024* (2006.01)
*H01S 5/40* (2006.01)
*H01S 5/00* (2006.01)

(52) U.S. Cl.
CPC ........ *H01S 5/02236* (2013.01); *H01S 5/0014* (2013.01); *H01S 5/02415* (2013.01); *H01S 5/4012* (2013.01); *H01S 5/4087* (2013.01)

(58) Field of Classification Search
CPC ............... H01S 5/02236; H01S 5/0014; H01S 5/02415; H01S 5/4012; H01S 5/4087; H01S 5/02208; H01S 5/02212
See application file for complete search history.

(56) References Cited

U.S. PATENT DOCUMENTS

2004/0163836 A1\* 8/2004 Kumar ................. H01S 5/02212
174/50
2018/0138657 A1\* 5/2018 Miura ....................... G02B 6/32

\* cited by examiner

*Primary Examiner* — Armando Rodriguez
(74) *Attorney, Agent, or Firm* — Grossman Tucker Perreault & Pfleger, PLLC; Norman S. Kinsella

(57) ABSTRACT

The present disclosure is generally directed to a multi-channel TOSA with vertically-mounted MPDs to reduce TOSA housing dimensions and improve RF driving signal quality. In more detail, a TOSA housing consistent with the present disclosure includes at least one vertical MPD mounting surface that extends substantially transverse relative to a LD mounting surface, with the result being that a MPD coupled to the vertical MPD mounting surface gets positioned above an associated LD coupled to the LD mounting surface. The vertically-mounted MPD thus makes regions adjacent an LD that would otherwise be utilized to mount an MPD available for patterning of conductive RF traces to provide an RF driving signal to the LD. The conductive RF traces may therefore extend below the vertically-mounted MPD to a location that is proximate the LD to allow for relatively short wire bonds therebetween.

19 Claims, 8 Drawing Sheets

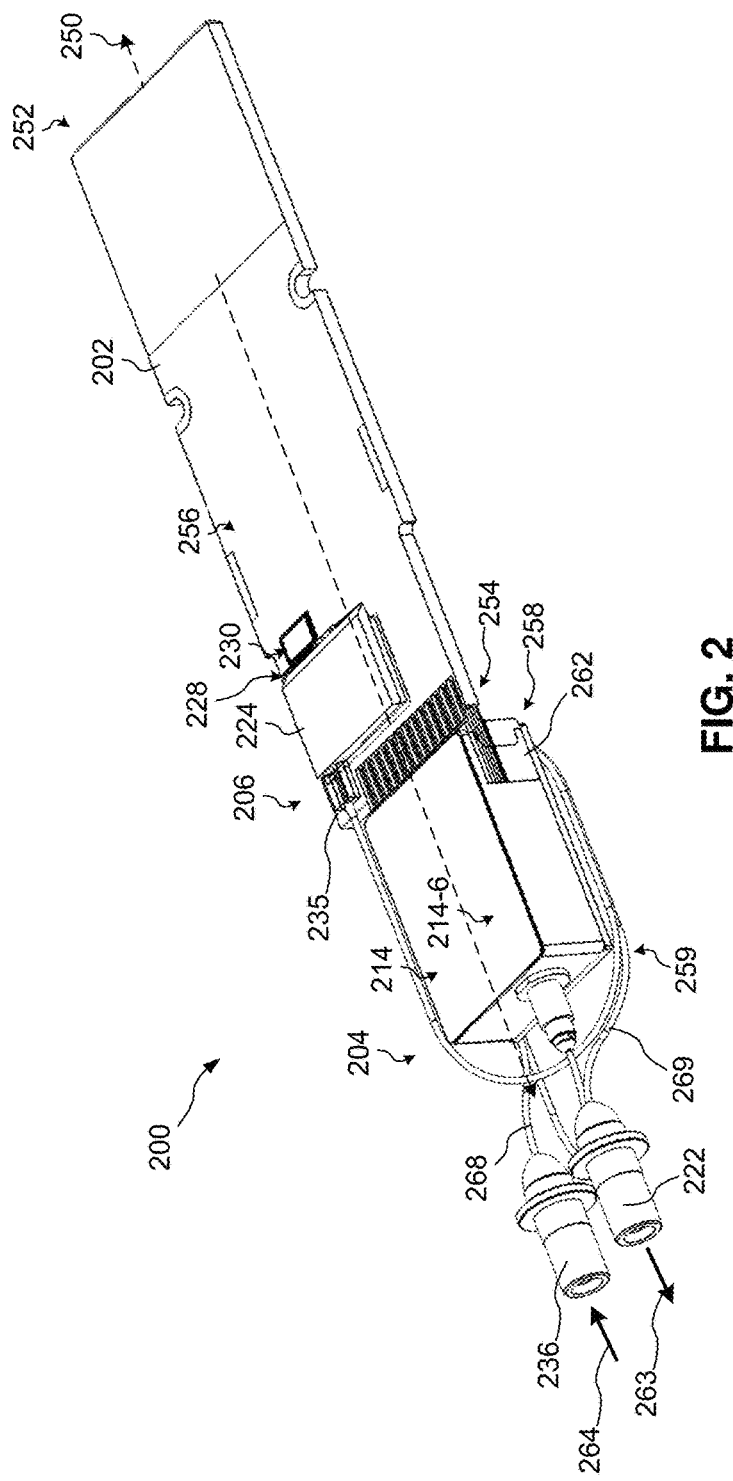
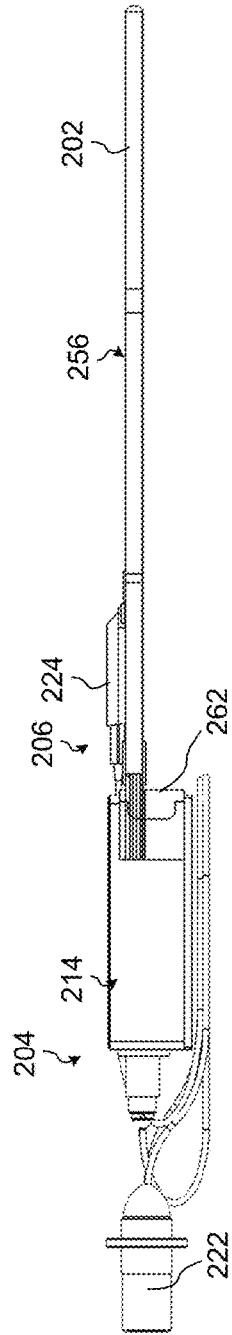
FIG. 2
FIG. 3

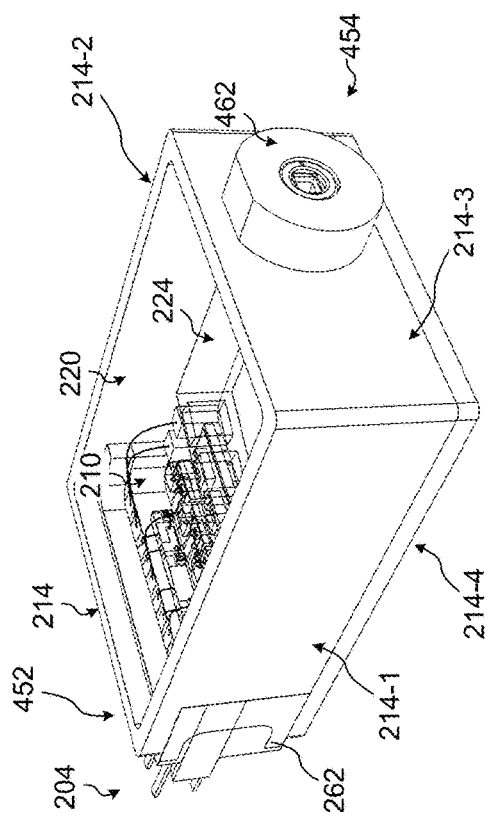

TRANSMITTER OPTICAL SUBASSEMBLY ARRANGEMENT WITH VERTICALLY-MOUNTED MONITOR PHOTODIODES

TECHNICAL FIELD

The present disclosure relates to optical communications, and more particularly, to a transmitter optical subassembly (TOSA) arrangement having vertically-mounted monitor photodiodes to reduce housing dimensions and improve radio frequency (RF) drive signal quality.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceiver modules generally include one or more transmitter optical subassemblies (TOSAs) for transmitting optical signals. TOSAs can include one or more lasers to emit one or more channel wavelengths and associated circuitry for driving the lasers. Some optical applications, such as long-distance communication, can require TOSAs to include hermetically-sealed housings with arrayed waveguide gratings, temperature control devices, laser packages and associated circuitry disposed therein to reduce loss and ensure optical performance. However, the inclusion of hermetically-sealed components increases manufacturing complexity, cost, and raises numerous non-trivial challenges within space-constrained housings.

BRIEF DESCRIPTION OF THE DRAWINGS

These and other features and advantages will be better understood by reading the following detailed description, taken together with the drawings wherein:

FIG. 2 is a perspective view of an optical transceiver module consistent with embodiments of the present disclosure.

FIG. 3 is a side view of the optical transceiver module of FIG. 2 in accordance with an embodiment of the present disclosure.

FIGS. 4-5 collectively show an example TOSA arrangement suitable for use in the optical transceiver module of FIGS. 2-3, in accordance with an embodiment of the present disclosure.

DETAILED DESCRIPTION

As discussed above, some TOSAs can reach optical transmission distances of up to 10 km or more. Such TOSAs may be suitable for use in C form-factor pluggable (CFP), CFP2, CFP4 and quad small form-factor pluggable (QSFP) applications. In general, such TOSAs include a hermetic-sealed package (or housing) with an LC receptacle (or other suitable port) for optical coupling. The hermetic-sealed package can house laser packages, e.g., electro-absorption modulator integrated lasers (EMLs), power monitors photodiodes (PDs), thermoelectric coolers (TECs), an optical multiplexer such as an arrayed waveguide grating (AWG) for multiplexing multiple channel wavelengths, and electrical interconnects such as flexible printed circuit boards, and optical interconnects such as fiber stubs. Hermetic-sealed packages can include cavities specifically designed to house such components in a manner that optimizes the space constraints and promotes thermal communication. However, manufacturing hermetic-sealed packages with the dimensions necessary to fit the components of the light engine increases manufacturing cost and complexity.

Figure 10:
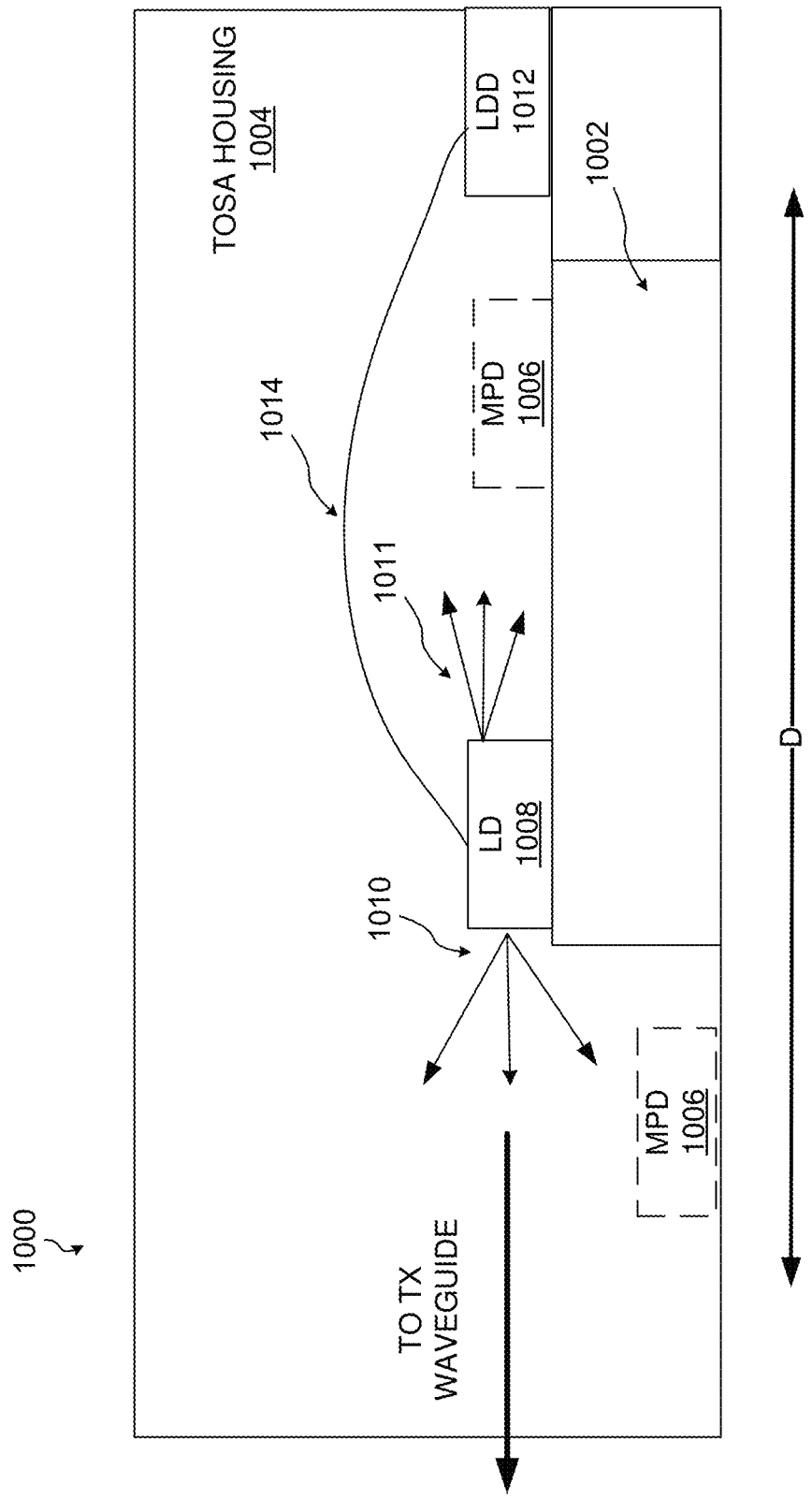
FIG. 10 shows an existing approach to registering optical power of a laser arrangement.

One component in such TOSAs that can result in increased cost and complexity is monitor photodiodes (MPDs). MPDs can be used to monitor optical power of a corresponding laser diode. However, existing approaches tend to position MPDs behind, in front of, or otherwise adjacent an associated laser diode. In some cases, MPDs are mounted to the same substrate as the associated LD. For example, FIG. 10 shows one example of laser arrangement 1000 whereby a sidewall of a TOSA housing 1004 supports a substrate 1002 (or submount), and the substrate 1002 and/or the surface of the TOSA housing 1004 supports LD 1008 and the MPD 1006. One position utilized for registering optical power from an LD by an MPD 1006 is directly behind the LD 1008 to receive a small portion of optical power 1011 emitted by the LD 1008 backwards away from a transmit (TX) waveguide, e.g., an optical fiber. Another position includes mounting the MPD 1006 below or otherwise in front of the LD 1008 to directly receive the optical power 1010 emitted by the LD 1008.

In either case, the TOSA housing 1004 must be dimensioned to accommodate the position of the MPD 1006, with the result being an overall increase in housing length along dimension D. This results in two significant challenges for TOSA designs. First, the position of the MPD, e.g., behind the LD 1008, can require that interconnect circuitry such as wire bonds 1014 that extend from the laser diode driver (LDD) 1012 to the LD 1008 must be lengthened to route over/around the MPD 1006. Extending and routing the wire bonds 1014 in this fashion can result in time-of-flight (TOF) delays and impedance matching issues as well as worse RF performance. Second, increasing the overall length can increase the overall volume of the TOSA housing cavity and the complexity in the manufacture of the TOSA. In scenarios where hermetically-sealed housings are utilized, this can result in a significantly higher cost and time per unit to manufacture, which can ultimately reduce yield.

Thus, the present disclosure is generally directed to a multi-channel TOSA with vertically-mounted MPDs to reduce TOSA housing dimensions and improve RF driving signal quality. In more detail, a TOSA housing consistent with the present disclosure includes at least one vertical MPD mounting surface that extends substantially transverse relative to a LD mounting surface, with the result being that a MPD coupled to the vertical MPD mounting surface gets positioned above an associated LD coupled to the LD mounting surface. The vertically-mounted MPD thus makes regions adjacent an LD that would otherwise be utilized to mount an MPD available for patterning of conductive RF traces to provide an RF driving signal to the LD. The conductive RF traces may therefore extend below the vertically-mounted MPD to a location that is proximate the LD to allow for relatively short wire bonds therebetween.

In a specific example embodiment, the vertical MPD mounting surface may be provided at least in part by a feedthrough device of the TOSA housing. The feedthrough device can be configured to be at least partially disposed in a hermetically-sealed cavity of the TOSA housing to provide electrical connectivity to optical components therein. The feedthrough device may also provide a conductive trace mounting surface that extends substantially transverse relative to the vertical MPD mounting surface for purposes of patterning the above-discussed conductive RF traces. Accordingly, an MPD may be securely mounted to the feedthrough device prior to insertion of the feedthrough device into a TOSA housing. Likewise, the conductive RF traces and other associated circuitry (e.g., filtering capacitors, conductive direct current (DC) traces, and so on) may be patterned/disposed when the feedthrough device is outside of the TOSA housing. Thus, insertion of the feedthrough device within the TOSA housing can result in the vertically-mounted MPD being passively optically aligned with an associated LD, and the conductive RF traces being brought within a predefined distance of the LD for electrical coupling purposes via, for instance, wire bonds.

The present disclosure therefore provides numerous advantageous over other TOSA approaches. For example, manufacturing of a TOSA may be conducted in a modular fashion whereby a feedthrough device and TOSA housing may be manufactured and configured separate from each other. For instance, components such as conductive traces and MPDs may be mounted/coupled to the feedthrough device in a parallel manufacturing process to allow for the TOSA housing and associated components to be completed apart from the feedthrough device, with the net result decreasing production time, reducing errors, and ultimately increasing yield. In addition, a TOSA housing with vertically-mounted MPDs consistent with the present disclosure advantageously reduces overall housing dimensions while allowing for LDs to be disposed in close proximity of conductive traces for electrical coupling purposes. RF signal quality may therefore be enhanced via relatively short wire bonds, for example, while simultaneously reducing cost, time-per-unit, and complexity to manufacture each TOSA.

As used herein, the terms hermetic-sealed and hermetically-sealed may be used interchangeably and refer to a housing that releases a maximum of about $5*10-8$ cc/sec of filler gas. The filler gas may comprise an inert gas such as nitrogen, helium, argon, krypton, xenon, or various mixtures thereof, including a nitrogen-helium mix, a neon-helium mix, a krypton-helium mix, or a xenon-helium mix.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM.

The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. On the other hand, the term "direct optical coupling" refers to an optical coupling via an optical path between two elements that does not include such intermediate components or devices, e.g., a mirror, waveguide, and so on, or bends/turns along the optical path between two elements.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Figure 1:
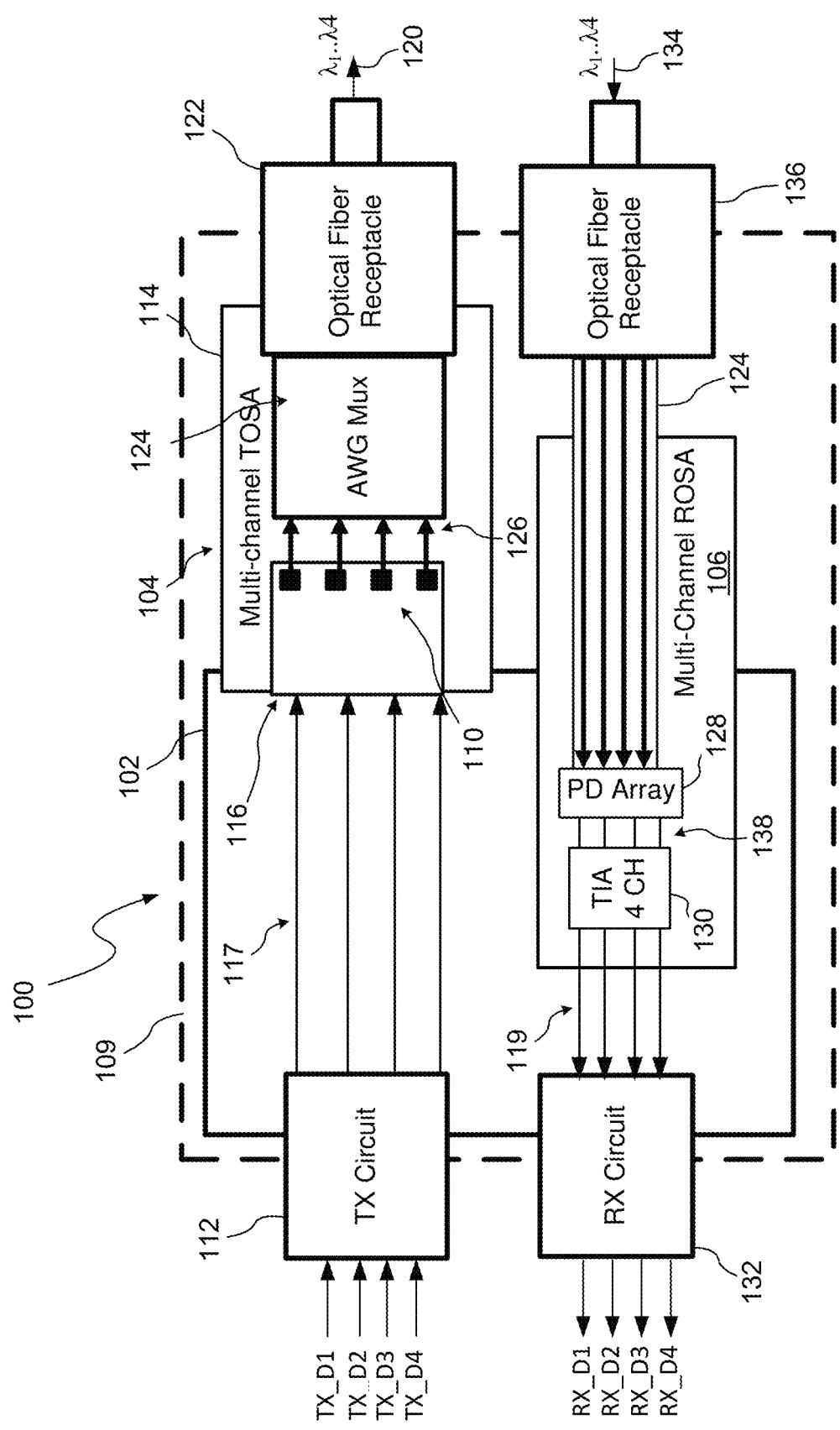
FIG. 1 is a block diagram of a multi-channel optical transceiver module, consistent with embodiments of the present disclosure.
Figure 6:
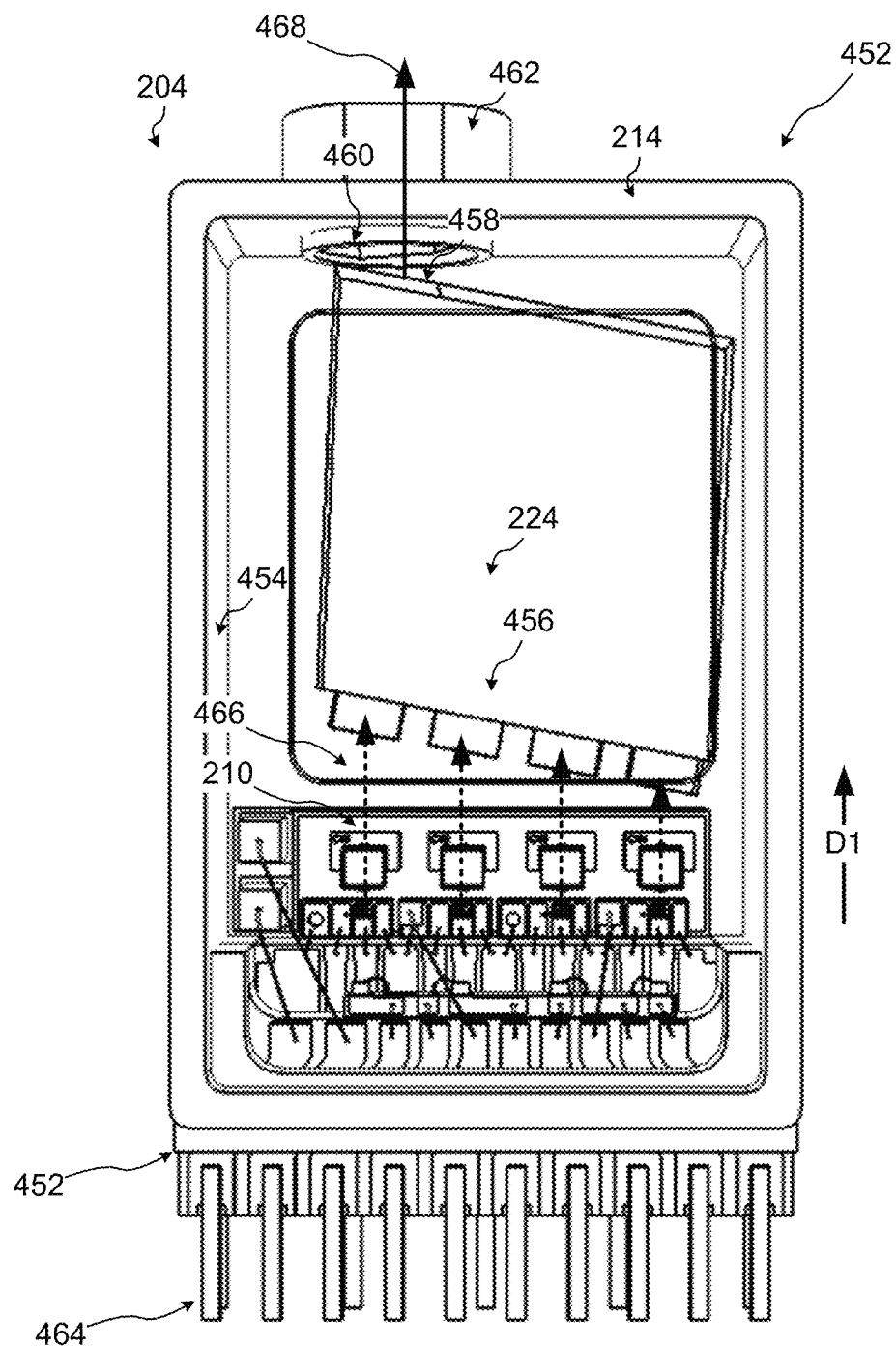
FIG. 6 is a top view of the example TOSA arrangement of FIGS. 4-5, consistent with embodiments of the present disclosure.

Referring to the Figures, FIG. 1, an optical transceiver 100, consistent with embodiments of the present disclosure, is shown and described. In this embodiment, the optical transceiver 100 includes a multi-channel TOSA arrangement and a multi-channel ROSA arrangement 106 coupled to a substrate 102, which may also be referred to as an optical module substrate. The substrate 102 may comprise, for example, a printed circuit board (PCB) or PCB assembly (PCBA). The substrate 102 may be configured to be "pluggable" for insertion into an optional transceiver cage 109.

In the embodiment shown, the optical transceiver 100 transmits and receives four (4) channels using four different channel wavelengths ($\lambda 1$, $\lambda 2$, $\lambda 3$, $\lambda 4$) via the multi-channel TOSA arrangement 104 and the multi-channel ROSA arrangement 106, respectively, and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in Internet data center applications or fiber to the home (FTTH) applications. Although the following examples and embodiments show and describe a 4-channel optical transceiver, this disclosure is not limited in this regard. For example, the present disclosure is equally applicable to 2, 6, or 8-channel configurations.

In more detail, the multi-channel TOSA arrangement 104 includes a TOSA housing 114 with a plurality of sidewalls that define an optical component cavity 220, which may be referred to as simply a cavity (See FIG. 4). The cavity 220 includes a plurality of laser arrangements 110 disposed therein, which will be discussed in more detail below, with each laser arrangement of the plurality of laser arrangements 110 being configured to transmit optical signals having different associated channel wavelengths. Each laser arrangement may include passive and/or active optical components such as a laser diode (LD), monitor photodiode (MPD), laser diode driver (LDD), and so on. Additional components comprising each laser arrangement include filters, focusing lenses, filtering capacitors, and so on.

To drive the plurality of laser arrangements 110, the optical transceiver 100 includes a transmit connecting circuit 112 to provide electrical connections to the plurality of laser arrangements 110 within the housing 114. The transmit connecting circuit 112 may be configured to receive driving signals (e.g., TX_D1 to TX_D4) from, for example, circuitry within the optical transceiver cage 109. As shown, the housing 114 may be hermetically sealed to prevent ingress of foreign material, e.g., dust and debris. Therefore, a plurality of transit (TX) traces 117 (or electrically conductive paths) are patterned on at least one surface of the substrate 102 and are electrically coupled with a feedthrough device 116 of the TOSA housing 114 to bring the transmit connecting circuit 112 into electrical communication with the plurality of laser arrangements 110, and thus, electrically interconnect the transmit connecting circuit 112 with the multi-channel TOSA arrangement 104. The feedthrough device 116 may comprise, for instance, ceramic, metal, or any other suitable material.

In operation, the multi-channel TOSA arrangement 104 may then receive driving signals (e.g., TX_D1 to TX_D4), and in response thereto, generates and launches multiplexed channel wavelengths on to an output waveguide 120 such as a transmit optical fiber. The generated multiplexed channel wavelengths may be combined based on a multiplexing device 124 such as an arrayed waveguide grating (AWG) that is configured to receive emitted channel wavelengths 126 from the plurality of laser assemblies 110 and output a signal carrying the multiplexed channel wavelengths on to the output waveguide 120 by way of optical fiber receptacle 122.

Continuing on, the multi-channel ROSA arrangement 106 includes a demultiplexing device 124, e.g., an arrayed waveguide grating (AWG), a photodiode (PD) array 128, and an amplification circuitry 130, e.g., a transimpedance amplifier (TIA). An input port of the demultiplexing device 124 may be optically coupled with a receive waveguide 134, e.g., an optical fiber, by way of an optical fiber receptacle 136. An output port of the demultiplexing device 124 may be configured to output separated channel wavelengths on to the PD array 128. The PD array 128 may then output proportional electrical signals to the TIA 130, which then may be amplified and otherwise conditioned. The PD array 128 and the transimpedance amplifier 136 detect and convert optical signals received from the receive waveguide 134, e.g., an optical fiber, into electrical data signals (RX_D1 to RX_D4) that are output via the receive connecting circuit 108. In operation, the PD array 128 may then output electrical signals carrying a representation of the received channel wavelengths to a receive connecting circuit 132 by way of conductive traces 119 (which may be referred to as conductive paths).

Referring now to FIGS. 2-3, an example optical transceiver module 200 is shown consistent with an embodiment of the present disclosure. The optical transceiver module 200 may be implemented as the optical transceiver 100 of FIG. 1, the discussion of which is equally applicable to FIGS. 2-3 and will not be repeated for purposes of brevity. As shown, the optical transceiver module 200 includes a substrate 202 that extends from a first end 252 to a second end 254 along a longitudinal axis 250. The first end 252 may electrically couple to a transceiver cage to receive driving signals, e.g., TX_D1 to TX_D4, and therefore, may be referred to as an electrical coupling end. On the other hand, the second end 254 includes a multi-channel TOSA arrangement 204 and a multi-channel ROSA arrangement 206 for sending and receiving channel wavelengths, respectively, and therefore may be referred to as an optical coupling end.

In more detail, the substrate includes at least a first mounting surface 256 for mounting of optical components, patterning of conductive traces (e.g., conductive traces 117, 119). Disposed adjacent the first end 252, the substrate 202 includes a plurality of pads/terminals for electrically communicating with, for instance, associated circuitry in a transceiver cage. The substrate 202 includes a multi-channel TOSA arrangement 204 and multi-channel ROSA arrangement 206 disposed adjacent the second end. The multi-channel ROSA arrangement includes amplification circuitry 230, a PD array 228, and a demultiplexing device 224 disposed thereon. An input port 235 of the demultiplexing device 224 may be coupled to an optical coupling receptacle 236 by way of a receive intermediate fiber 268. Accordingly, the demultiplexing device 224 can receive a multiplexed signal 264 from a receive waveguide, e.g., the receive waveguide 134 of FIG. 1. An output port of the demultiplexing device 224 may be optically aligned with the PD array 228 and output separated channel wavelengths thereon. Electrical signals representative of the separated channel wavelengths may then be amplified/filtered by the amplification circuitry before being passed to the receive connecting circuit 132.

As shown, the TOSA housing 214 is defined by a plurality of sidewalls. A first end 258 of the TOSA housing edge mounts to, and electrically couples with, the second end 258 of the substrate 202. A second end 259 of the TOSA housing 214 couples to an optical coupling receptacle 222 by way of a transmit intermediate fiber 269. The first end 258 of the TOSA housing 214 may also be referred to as an electrical coupling end, and the second end 259 may also be referred to as an optical coupling end. In an embodiment, the TOSA housing 214 may be securely attached to the substrate 202 via one or more electrical interconnect devices as discussed and described in greater detail in co-pending U.S. patent application. Ser. No. 16/116,087 filed on Aug. 29, 2018 and entitled "Transmitter Optical Subassembly with Hermetically-Sealed Light Engine and External Arrayed Waveguide Grating", the teaching of which are hereby incorporated in their entirety.

In an embodiment, the TOSA housing 214 of the multi-channel TOSA arrangement 204 may be hermetically sealed, although in other embodiments the housing may not necessarily be hermetically sealed. Accordingly, the multi-channel TOSA arrangement 204 may also be referred to as a hermetically-sealed light engine that may be particularly well suited for long-distance transmission, e.g., up to and beyond 10 km. The TOSA housing 214 can include a feedthrough device 262 at least partially disposed in a cavity of the TOSA housing 214 to allow for electrical interconnection between the substrate 202 and the multi-channel TOSA arrangement 204. The housing 214 may include a longitudinal axis that extends substantially parallel relative to the longitudinal axis 250 of the substrate 202. The housing 214 may comprise, for example, metal, plastic, ceramic, or any other suitable material. The housing 214 may be formed from multiple pieces, or a single piece, of material.

The housing 214 may further define a laser cavity 220 (FIG. 4) which may be filled with an inert gas to form an inert atmosphere. In one embodiment, the inert atmosphere sealed within the hermetically-sealed container comprises nitrogen, and preferably, 1 atmosphere (ATM) of nitrogen. The inert atmosphere may also be formed from nitrogen, helium, argon, krypton, xenon, or various mixtures thereof, including a nitrogen-helium mix, a neon-helium mix, a krypton-helium mix, or a xenon-helium mix. The inert gas or gas mix included within the hermetically-sealed cavity 220 may be selected for a particular refractive index or other optical property. Gases may also be selected based on their ability to promote thermal insulation. For instance, Helium is known to promote heat transfer may be utilized alone or in addition to others of the aforementioned gases. In any event, the terms hermetic-sealed and hermetically-sealed may be used interchangeably and refers to a housing that releases a maximum of about $5*10-8$ cc/sec of filler gas.

Turning to FIGS. 4-7, an example embodiment of the TOSA housing 214 of the multi-channel TOSA arrangement 204 is shown in isolation. As shown, the housing 214 extends from a first end 452 to a second end 454 along a longitudinal axis 450. A plurality of sidewalls 214-1 to 214-6 define the TOSA housing 214 and a cavity 220 therebetween. Note, the embodiment shown in FIG. 4 omits the sidewall 214-6 (FIG. 2) that forms a cover portion merely for purposes of clarity.

The feedthrough device 262 at least partially defines the first end 452 of the TOSA housing 214 and includes a plurality of electrical interconnects 464, e.g., bus bars, external to the cavity 220 for mounting to and electrically coupling with the substrate 102. The plurality of electrical interconnects 464 can provide power and radio frequency (RF) driving signals to the plurality of laser arrangements 210. The feedthrough device 262 further includes at least one mounting surface such as a vertical monitor photodiode (MPD) mounting surface, which will be discussed in greater detail below.

Following the feedthrough device 262 within the cavity 220, a plurality of laser arrangements 210 are disposed on and are supported by a mounting surface provided at least in part by the sidewall 214-4. A multiplexing device 224 is also disposed on and supported by the mounting surface provided at least by the sidewall 214-4. The multiplexing device 224 includes a plurality of input ports 456, with each input port being optically aligned with an associated laser arrangement of the plurality of laser arrangements 210. The multiplexing device 224 further includes an output port 458 which is shown more clearly in FIG. 6. The output port 458 of the multiplexing device 224 is optically aligned with an aperture 462 defined by the sidewall 214-3 of the TOSA housing 214. The aperture 462 may then transition to a fiber coupling receptacle 462, with the fiber coupling receptacle 462 being configured to receive the intermediate optical fiber 269 (FIG. 2).

Thus, in operation, the multiplexing device 224 receives channel wavelengths 466 emitted by the plurality of laser assemblies along direction D1 at the plurality of inputs and then outputs a multiplexed signal 468 having each of the emitted channel wavelengths 466 for transmission via an external transmit optical fiber, for example.

Figure 7:
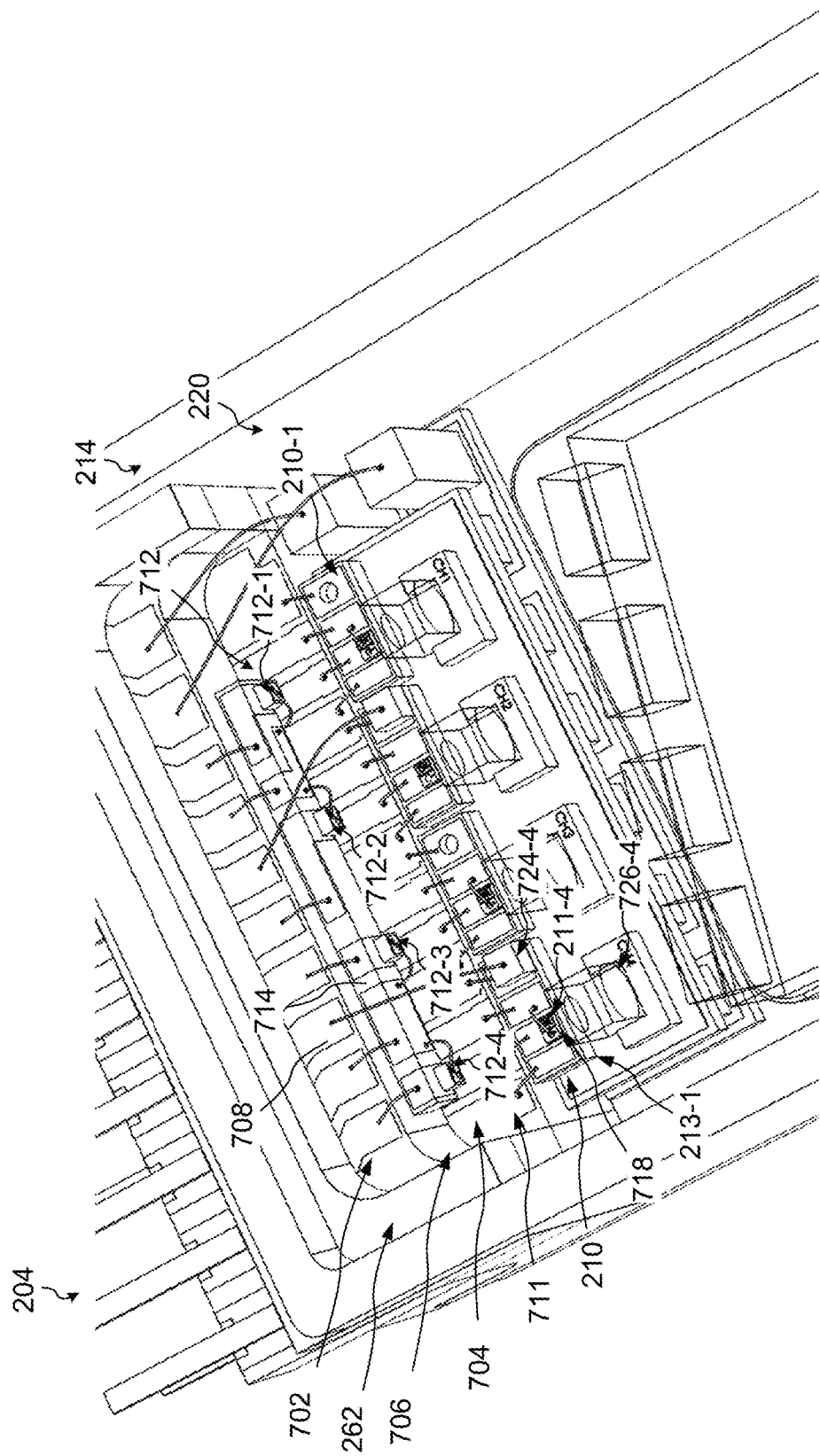
FIG. 7 shows an enlarged portion of a cavity of the example TOSA arrangement of FIGS. 4-6, in accordance with an embodiment of the present disclosure.

FIG. 7 shows an enlarged perspective view of the cavity 220 of the housing 214 in accordance with an embodiment. As shown, the feedthrough device 262 includes a step/shoulder configuration defined by a first mounting surfacing 702 that extends in parallel with the longitudinal axis 450 of the TOSA housing 214, a second mounting surface 704 that extends parallel with the first mounting surface, and a third mounting surface 706 that adjoins the first and second mounting surfaces 702, 704 and extends substantially transverse to each of the same. Thus, the first, second and third mounting surfaces 702, 704 and 706 provide a multi-tiered or multi-step mounting structure for coupling to optical components. Each of the mounting surfaces of the feedthrough device 262 will now be discussed in turn.

The first mounting surface 702 includes a first plurality of conductive traces/paths 708 patterned thereon. The first plurality of conductive traces 708 may be configured to provide power from the substrate 202 and to pass data signals from a plurality of MPDs 712 that are mounted to and supported by the third mounting surface. To this end, the first mounting surface 702 may also be referred to as a MPD trace mounting surface/section. The second mounting surface 704 includes a second plurality of conductive traces/paths 711 disposed thereon. The second plurality of conductive traces/paths 711 may be configured to provide power and data signals from the substrate 202 to each of the plurality of lasers arrangements 210. To this end, the second mounting surface 704 may be referred to as a LD trace mounting surface/section.

Continuing on, the third mounting surface 706 extends substantially transverse relative to the first and second mounting surfaces 702, 704 and adjoins the same, as discussed above. The third mounting surface 706 may be configured to mount and support a plurality of MPDs shown collectively as 712 and individually as 712-1 to 712-4. Each MPD of the plurality of MPDs 712 may be supported by a MPD submount 714, with the MPD submount 714 providing electrical traces for electrically interconnecting MPDs to associated conductive traces of the MPD trace mounting section 708. The MPD submount 714 may be a single piece, e.g., a single PCB or other suitable substrate, or may be multiple pieces. One advantage of a single piece MPD submount 714 is that attachment and alignment of MPDs to the feedthrough device 262 can be simplified as each MPD may be placed on to the MPD submount 714 at predefined positions prior to insertion of the feedthrough device 262 into the cavity 202 of the housing 214. Accordingly, coupling the MPD submount 714 to the feedthrough device 262 optically aligns each of the MPDs disposed thereon without necessarily performing additional alignment steps.

Figure 8A:
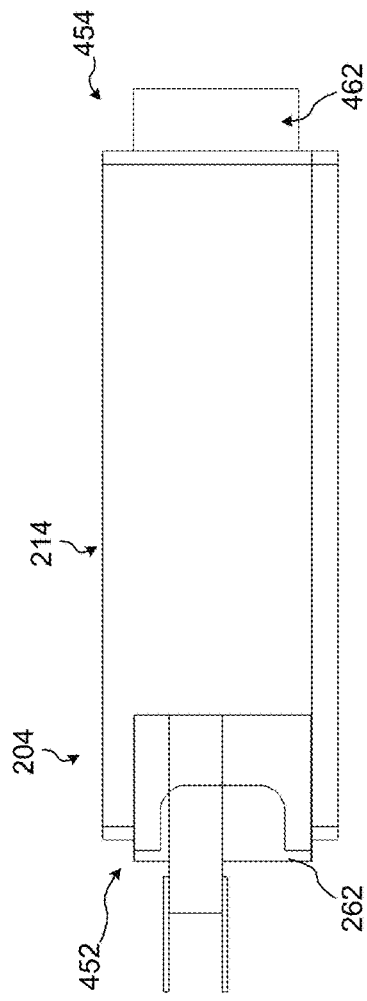
FIG. 8A is a side view of the example TOSA arrangement of FIGS. 4-7, in accordance with an embodiment of the present disclosure.
Figure 8B:
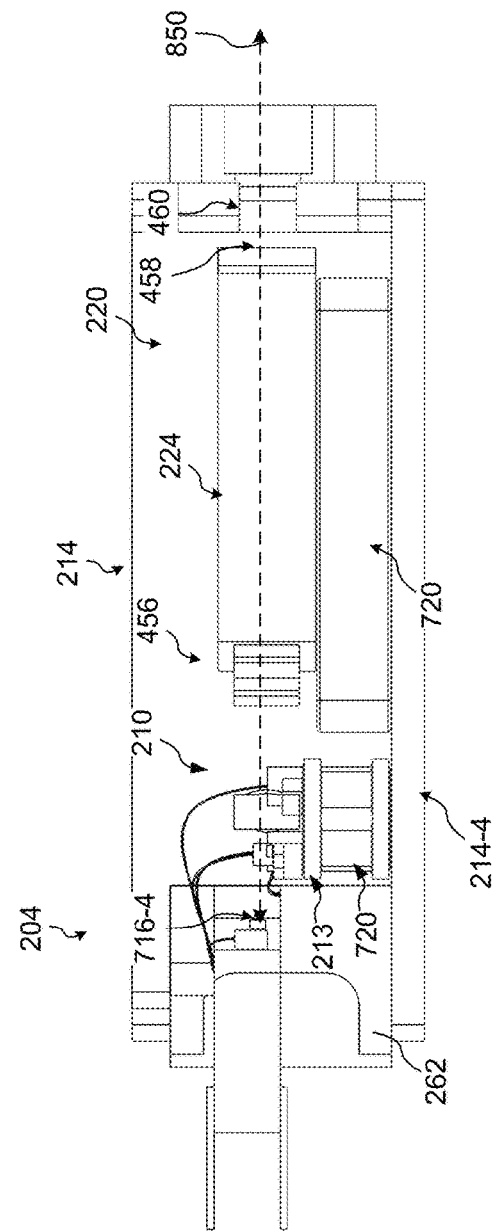
FIG. 8B is a cross-sectional view of the example TOSA arrangement of FIG. 5 taken along line 8B-8B, in accordance with an embodiment of the present disclosure.

As further shown, each MPD of the plurality of MPDs 712 includes a light receiving region, e.g., light receiving surface 716-4 of MPD 712-4 shown in FIG. 8B, on an upper/top surface of each chip that is optically aligned with a corresponding laser arrangement of the plurality of laser arrangements 210. This vertical mounting of each MPD allows for a smaller overall footprint for the feedthrough device 262, and by extension, shortens the overall length of the TOSA housing 214. This vertical mounting configuration achieves housing size reduction by freeing the space behind/adjacent each laser arrangement to permit the LD traces of the second mounting surface 704 to extend below the plurality of MPDs 712 and be disposed in close proximity of the plurality of laser assemblies 201. This removal of the MPDs from being behind/adjacent a corresponding laser arrangement also advantageously allows for relatively short electrical interconnection via wire bonding between the LD traces of the second mounting surface 704 and each laser arrangement, which reduces issues such as time of flight (TOF) and impedance mismatching that can ultimately degrade RF signal quality.

Continuing on, each of the plurality of laser arrangements 210 includes a laser diode supported by a laser submount 213 and optional thermoelectric cooling (TEC) arrangement. For instance, the laser arrangement 210-4 associated with channel 4 (CH4) includes a laser diode 211-4 mounted to and supported by the laser diode submount 213. As shown in the cross-sectional view of FIG. 8B, the laser diode submount 213 is mounted to and is supported by TEC devices 720. In turn, TEC devices 720 are mounted to and supported by a surface provided by sidewall 214-4 of the TOSA housing 214. The laser diode submount may also support thermistors such as thermistor 724-4 (FIG. 7). Following the plurality of laser assemblies 210, each laser arrangement can include a focusing lens e.g., focusing lens 726-4, mounted to and supported by the laser diode submount 713. The laser submount 213 may comprise a single piece, such as shown, or may be formed from multiple pieces.

Following the plurality of laser arrangements 210, the multiplexing device 224 is mounted to and is supported by a multiplexing submount 720. The input ports 456 of the multiplexing device 224 are optically aligned with the plurality of laser arrangements 210. To this end, a plurality of optical paths 850 extend longitudinally through the cavity 220, with each optical path extending from a corresponding laser diode. A portion of optical power, e.g., 2% or less, gets emitted from a surface opposite the emission face of each LD (also known as a back-side emission surface) and is registered by each MPD, e.g., converted to a proportional electrical current, to form a feedback loop to ensure optical power. Thus, each of the plurality of optical paths 850 also intersects with the vertically mounted MPDs 712, and more particularly, a light receiving region of each corresponding vertically mounted MPDs 712, e.g., light receiving region 716-4.

During operation, channel wavelengths emitted by each of the plurality of laser assemblies 210 is launched on to a corresponding path of the plurality of optical paths 850, with each of the plurality of optical paths 850 extending substantially parallel relative to each other. As discussed above, a portion of the optical power gets emitted from a surface opposite of the emission surface of each laser diode, which may be referred to as a back-side emission surface, thus launching a portion of optical power towards the MPDs 712. Each light receiving region of the MPDs, e.g., light receiving region 716-4, then registers this portion of optical power for purposes of providing a feedback loop, e.g., by converting optical power to a proportional electrical current. The emitted channel wavelengths then get received via input ports 456 of the multiplexing device 224. The multiplexing device 224 then combines the received channel wavelengths into a multiplexed optical signal 263 (see FIG. 2). At an output 458 of the multiplexing device 224 the multiplexed signal 263 is output via the aperture on to the intermediate optical fiber 269 (See FIG. 2), and then ultimately to an external transmit optical fiber (not shown).

Figure 9:
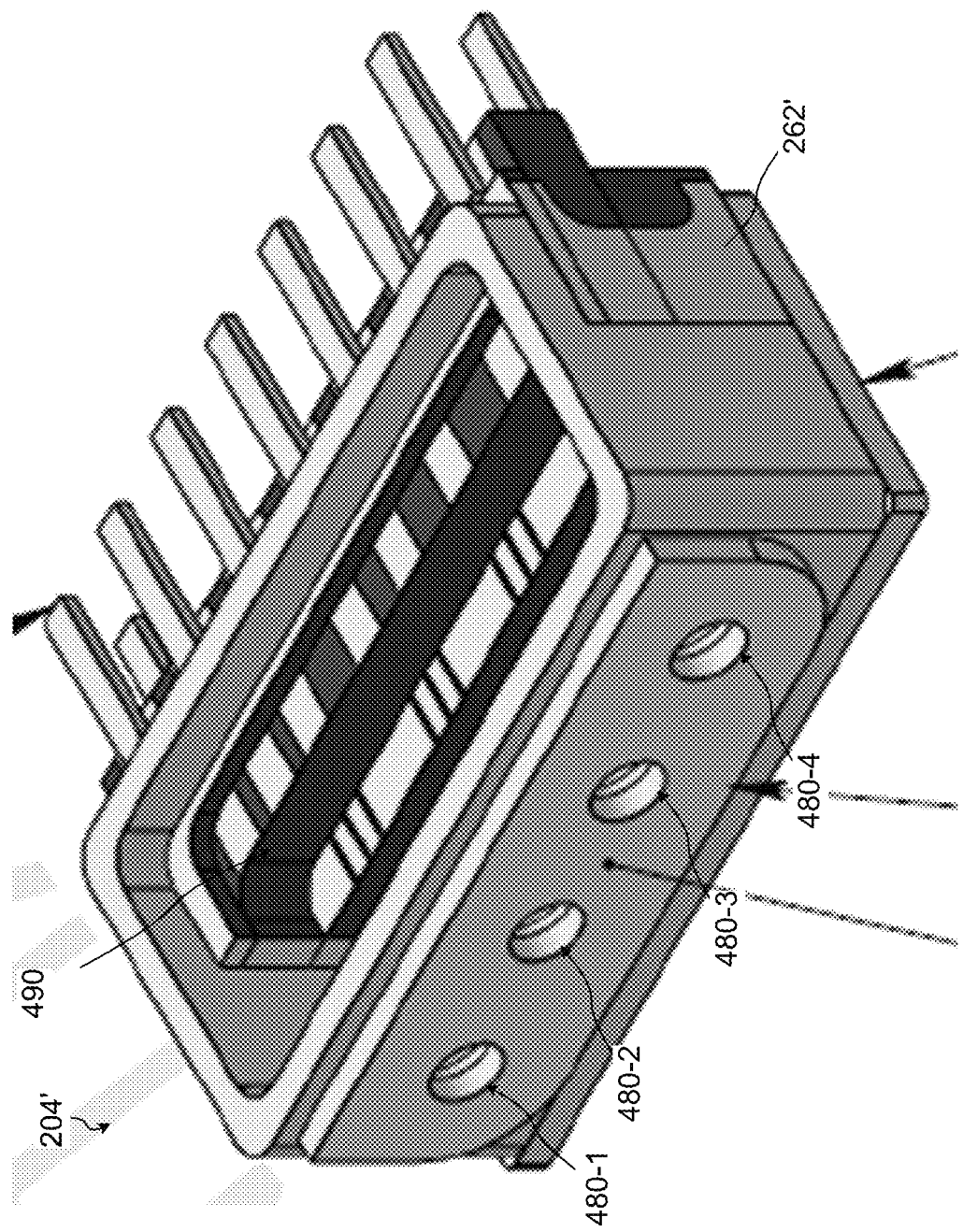
FIG. 9 is another example TOSA arrangement suitable for use in the optical transceiver module of FIGS. 2-3, in accordance with an embodiment of the present disclosure.

FIG. 9 shows another example embodiment of a TOSA housing 204' in accordance with aspects of the present disclosure. As shown, the TOSA housing 204' includes a plurality of sidewalls to provide a cavity therebetween, which is substantially similar to that of the TOSA housing 204. However, the TOSA housing 204' does not include a multiplexing device within the cavity and instead couples to a first end of a plurality of waveguides (not shown), e.g., optical fibers, via apertures 480-1 to 480-4. A second end of the plurality of waveguides may be optically coupled to an external multiplexing device, such as an AWG. This allows the TOSA 204' to have a relatively small overall footprint, which can significantly reduce overall costs and complexity that characterizes hermetically-sealed housing. Put simply, the lesser the volume and number of passive/optical components within the cavity of the TOSA housing 204', the less the complexity, time and cost necessary to manufacture the TOSA housing 204'. The feedthrough device 262' may be configured substantially similar to that of the feedthrough device 262, the description of which is equally applicable to the embodiment of FIG. 9 but will not be repeated for brevity. For instance, the vertical MPD mounting surface 490 allows for MPDs to be mounted thereon to advantageously reduce the overall length of the TOSA housing 204' relative to other approaches that place MPDs behind or otherwise adjacent corresponding LDs.

In accordance with an aspect of the present disclosure a transmitter optical subassembly (TOSA) module is disclosed. The TOSA module comprising a laser diode (LD) mounting surface, at least a first LD disposed on the LD mounting surface, the first LD having a back-side emission surface for emitting a portion of optical power along a first optical path, a base portion providing a vertical MPD mounting surface, and a first MPD disposed on the vertical MPD mounting surface, the first MPD having a light receiving region optically aligned with the first LD via the first optical path based at least in part on the vertical MPD mounting surface extending substantially transverse relative to the LD mounting surface such that the first optical path intersects with the light receiving region of the first MPD.

In accordance with another aspect of the present disclosure a method for optically coupling monitor photodiodes (MPDs) to corresponding laser diodes (LDs) in a multi-channel optical transceiver (TOSA) housing is disclosed. The method comprising mounting at least one MPD to a vertical MPD mounting surface provided by a feedthrough device, patterning a plurality of conductive traces on to one or more surfaces of the feedthrough device, and inserting the feedthrough device into a cavity of the TOSA housing to bring the plurality of conductive traces into close proximity with the LDs in the TOSA, wherein inserting the feedthrough device into the cavity causes each of the at least one MPDs mounted to the vertical MPD mounting surface to optically couple with a back-side emission surface of each corresponding LD.

In accordance with yet another aspect of the present disclosure a multi-channel optical transceiver module is disclosed. The multi-channel optical transceiver including a printed circuit board assembly (PCBA), a transmitter optical subassembly (TOSA) arrangement coupled to the PCBA, the TOSA arrangement comprising a laser diode (LD) mounting surface, at least a first LD disposed on the LD mounting surface, the first LD having a back-side emission surface for emitting a portion of optical power along a first optical path, a base portion providing a vertical MPD mounting surface, a first MPD disposed on the vertical MPD mounting surface, the first MPD having a light receiving region optically aligned with the first LD via the first optical path based at least in part on the vertical MPD mounting surface extending substantially transverse relative to the LD mounting surface such that the first optical path intersects with the light receiving region of the first MPD.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transmitter optical subassembly (TOSA) module, the TOSA module comprising:
 a laser diode (LD) mounting surface;
 at least a first LD disposed on the LD mounting surface, the first LD having a back-side emission surface for emitting a portion of optical power along a first optical path;
 a base portion comprising a feedthrough device, the feedthrough device providing a vertical MPD mounting surface; and
 a first MPD disposed on the vertical MPD mounting surface, the first MPD having a light receiving region optically aligned with the first LD via the first optical path based at least in part on the vertical MPD mounting surface extending substantially transverse relative to the LD mounting surface such that the first optical path intersects with the light receiving region of the first MPD.

2. The TOSA module of claim 1, further comprising:
 a housing having a plurality of sidewalls that define a cavity, the LD mounting surface being disposed in the cavity; and
 wherein the feedthrough device is configured to at least partially be disposed in the cavity of the housing, and wherein a first end of the feedthrough device provides an electrical coupling region to electrically couple to an optical module substrate to receive a radio frequency (RF) driving signal to drive the first LD, and a second end of the feedthrough device defines the vertical MPD mounting surface, the vertical MPD mounting surface being disposed in the cavity.

3. The TOSA module of claim 2, wherein the cavity of the housing is hermetically sealed to prevent ingress of contaminants.

4. The TOSA module of claim 2, wherein at least one sidewall of the plurality of sidewalls of the housing provides a thermoelectric cooler (TEC) mounting section, and wherein the TOSA provides:
 a thermoelectric cooler (TEC) arrangement mounted to the TEC mounting section; and
 a LD submount disposed on the TEC arrangement, the LD submount being in thermal communication with the TEC arrangement, and wherein the LD submount provides the LD mounting surface.

5. The TOSA module of claim 1, further comprising a plurality of transmit (TX) radio frequency (RF) traces, the TX RF traces being disposed on a surface of the base that extends away from the vertical mounting surface along a direction that is substantially parallel with the LD mounting surface.

6. The TOSA module of claim 5, wherein the plurality of TX RF traces are disposed below the MPD when mounted to the vertical MPD mounting surface to allow the plurality of TX RF traces to extend towards the LD mounting surface, and wherein a portion of the plurality of TX RF traces are disposed adjacent the LD mounting surface.

7. The TOSA module of claim 1, further comprising a second LD disposed on the LD mounting surface and a second MPD disposed on the vertical MPD mounting surface, the second LD being configured to emit an associated channel wavelength different from that of the first LD, and wherein the second LD and second MPD are optically aligned via a second optical path such that the second optical path extends from a back-side emission surface of the second LD and intersects with a light receiving region of the second MPD.

8. The TOSA module of claim 7, further comprising a multiplexing arrangement, the multiplexing arrangement having at least first and second input ports optically aligned with the first and second optical paths, respectively, to receive and combine channel wavelengths emitted by the first and second LDs into a multiplexed optical signal for output via an output port.

9. The TOSA module of claim 8, wherein the multiplexing arrangement includes an arrayed waveguide grating AWG to multiplex the received channel wavelengths, and wherein AWG provides the output port and passes the multiplexed optical signal on to a transmit waveguide coupled to the output port.

10. The TOSA module of claim 8, wherein the first and second input ports of the multiplexing arrangement are angled relative to the light emitting region of the first and second LDs such that incident channel wavelengths received along the first and second optical paths intersect at an angle of about 8 degrees to prevent back reflection.

11. A method for optically coupling monitor photodiodes (MPDs) to corresponding laser diodes (LDs) in a multi-channel optical transceiver (TOSA) housing, the method comprising:
 mounting at least one MPD to a vertical MPD mounting surface provided by a feedthrough device;
 patterning a plurality of conductive traces on to one or more surfaces of the feedthrough device; and
 inserting the feedthrough device into a cavity of the TOSA housing to bring the plurality of conductive traces into close proximity with the LDs in the TOSA, wherein inserting the feedthrough device into the cavity causes each of the at least one MPDs mounted to the vertical MPD mounting surface to optically couple with a back-side emission surface of each corresponding LD.

12. The method of claim 11, further comprising introducing an inert gas into the cavity to form a hermetic seal.

13. The method of claim 11, further comprising introducing wire bonds between the LDs and the plurality of conductive traces after insertion of the feedthrough device into the cavity of the TOSA housing.

14. The method of claim 11, wherein patterning the plurality of conductive traces includes disposing each conductive trace of the plurality of conductive traces on to a surface that extends below the vertical MPD mounting surface.

15. A multi-channel optical transceiver module comprising:
 a printed circuit board assembly (PCBA);
 a multi-channel transmitter optical subassembly (TOSA) arrangement coupled to the PCBA, the TOSA arrangement comprising:
  a laser diode (LD) mounting surface;
  at least a first LD disposed on the LD mounting surface, the first LD having a back-side emission surface for emitting a portion of optical power along a first optical path;
  a base portion comprising a feedthrough device, the feedthrough device providing a vertical MPD mounting surface;
  a first MPD disposed on the vertical MPD mounting surface, the first MPD having a light receiving region optically aligned with the first LD via the first optical path based at least in part on the vertical MPD mounting surface extending substantially transverse relative to the LD mounting surface such that the first optical path intersects with the light receiving region of the first MPD; and a multi-channel receiver optical subassembly arrangement.

16. The multi-channel optical transceiver of claim 15, wherein the TOSA arrangement further comprises:

a TOSA housing having a plurality of sidewalls that define a cavity, the LD mounting surface being disposed in the cavity; and wherein the feedthrough device is configured to at least partially be disposed in the cavity of the TOSA housing, and wherein a first end of the feedthrough device provides an electrical coupling region to electrically couple to an optical module substrate to receive a radio frequency (RF) driving signal to drive the first LD, and a second end of the feedthrough device defines the vertical MPD mounting surface, the vertical MPD mounting surface being disposed in the cavity of the TOSA housing.

17. The multi-channel optical transceiver of claim 16, wherein the cavity of the TOSA housing is hermetically sealed to prevent ingress of contaminants.

18. The multi-channel optical transceiver of claim 16, wherein at least one sidewall of the plurality of sidewalls of the TOSA housing provides a thermoelectric cooler (TEC) mounting section, and wherein the TOSA provides:

a thermoelectric cooler (TEC) arrangement mounted to the TEC mounting section; and a LD submount disposed on the TEC arrangement, the LD submount being in thermal communication with the TEC arrangement, and wherein the LD submount provides the LD mounting surface.

19. The multi-channel optical transceiver of claim 15, further comprising a plurality of transmit (TX) radio frequency (RF) traces, the TX RF traces being disposed on a surface of the base portion that extends away from the vertical mounting surface along a direction that is substantially parallel with the LD mounting surface, and wherein the TX RF traces are disposed below the MPD when mounted to the vertical MPD mounting surface to allow the TX RF traces to extend towards the LD mounting surface.

\* \* \* \* \*